US 6,624,706 B2

United States Patent
Higashi et al.

(10) Patent No.: US 6,624,706 B2
(45) Date of Patent: Sep. 23, 2003

(54) AUTOMATIC BIAS ADJUSTMENT CIRCUIT FOR USE IN PLL CIRCUIT

(75) Inventors: Hirohito Higashi, Kawasaki (JP); Hideki Ishida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/988,618

(22) Filed: Nov. 20, 2001

(65) Prior Publication Data
US 2002/0079973 A1 Jun. 27, 2002

(30) Foreign Application Priority Data
Dec. 27, 2000 (JP) .......................... 2000-398301

(51) Int. Cl.[7] .................. H03L 7/06; H03L 7/085; H03L 7/099
(52) U.S. Cl. .................. 331/17; 331/1 A; 331/34; 331/176
(58) Field of Search .................. 331/1 A, 16, 17, 331/18, 25, 34, 175, 176; 327/156–159; 332/127; 360/51; 375/376; 455/260

(56) References Cited

U.S. PATENT DOCUMENTS

| 5,604,465 A | 2/1997 | Farabaugh |
| 5,760,657 A | 6/1998 | Johnson |
| 5,986,485 A | 11/1999 | O'Sullivan |
| 6,150,887 A | 11/2000 | Yamaguchi |
| 6,326,855 B1 * | 12/2001 | Jelinek et al. ............... 331/57 |

FOREIGN PATENT DOCUMENTS

| EP | 1 033 815 A2 | 9/2000 |
| JP | 11-177416 | 7/1999 |

* cited by examiner

Primary Examiner—David C. Mis
(74) Attorney, Agent, or Firm—Arent Fox Kintner Plotkin & Kahn, PLLC (57) ABSTRACT

A bias current IB additionally provided to a current-controlled circuit 13 in a PLL circuit is the sum of bias currents IB1 and IB2 which are generated by a bias adjustment circuit (18, 19, 20, 21 and 22) and a bias current generating circuit (23 and 24), respectively. The bias adjustment circuit adjusts the bias current IB1 in response to an adjustment start signal ADJ such that a control voltage VC converges to a reference voltage VREF, and ceases the adjustment when the convergence has been achieved. The reference voltage VREF is determined to be a value at an almost middle point in a range of the variable VC in the PLL circuit. The bias current generating circuit has a circuit 23 generating a bias voltage VT and a circuit 24 converting the VT into a current IB2, wherein the temperature characteristic of the bias voltage VT is reverse to that of the control voltage VC under the condition that the frequency of an oscillation signal OCLK is fixed.

19 Claims, 10 Drawing Sheets

AUTOMATIC BIAS ADJUSTMENT CIRCUIT FOR USE IN PLL CIRCUIT

BACKGROUND OF THE INVENTION

1. Field of the Invention

The present invention relates generally to a PLL (Phase-Locked Loop) circuit, more particularly, to an automatic bias adjustment circuit adjusting a bias current provided to a CCO (Current Controlled Oscillator).

2. Description of the Related Art

Figure 8:
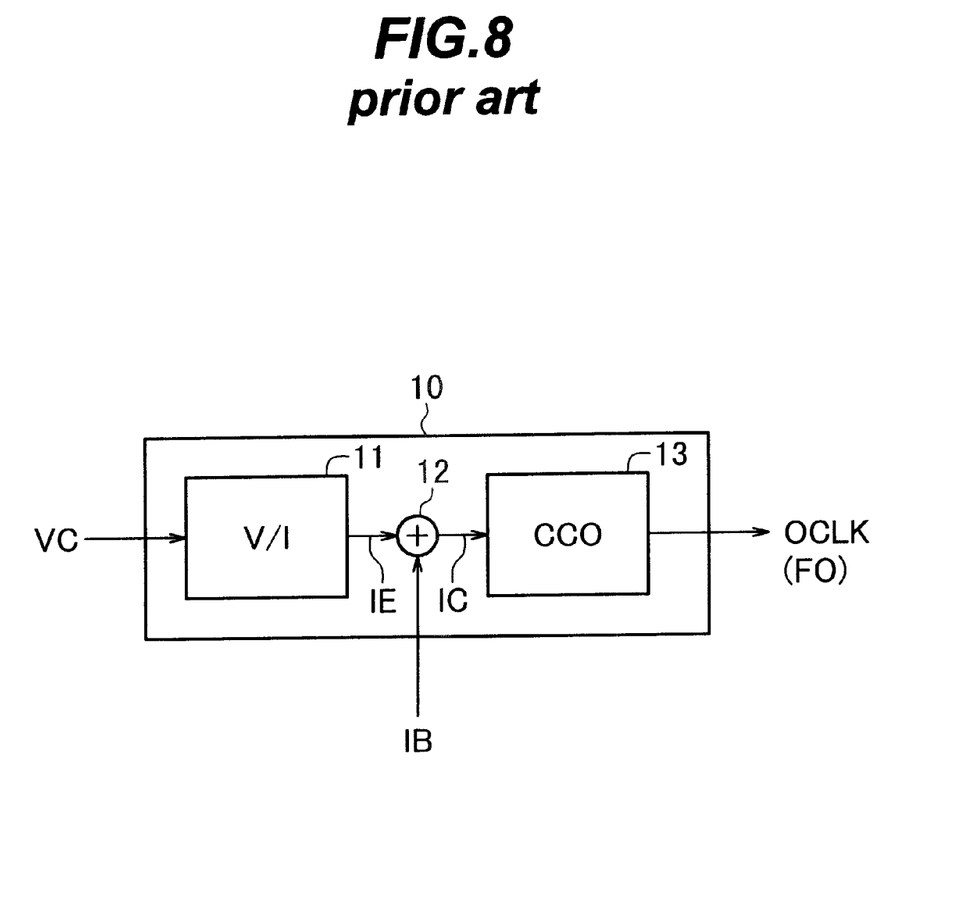
FIG. 8 is a block diagram of a prior art voltage controlled oscillator for use in a PLL circuit.

FIG. 8 shows a schematic configuration of a prior art voltage controlled oscillator (VCO) 10 for use in a PLL circuit.

In the VCO 10, a control voltage VC is converted into a current IE by a V/I converter circuit 11, and the current IE is added to a bias current IB by an adder 12 to make a control current IC, which is provided to a current-controlled oscillator (CCO) 13. The CCO 13 outputs an oscillation clock OCLK with a frequency FO according to the value of the control current IC.

Figure 9A:
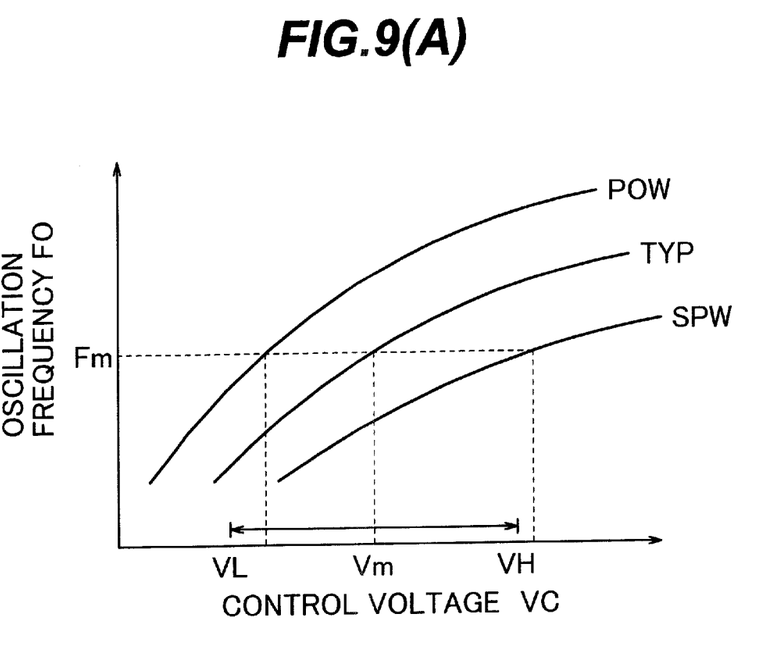

FIG. 9(A) shows characteristics of the oscillation frequency FO versus the control voltage VC of the VCO 10 when the bias current IB=0.

The characteristics vary largely with variations in fabrication process conditions, that is, variations in threshold voltage, gate length and gate insulating film thickness of FETs which are constituents of the VCO 10. A characteristic curve TYP in the figure is of a typical case, while other characteristic curves POW and SPW are of cases where the oscillation frequency FO are equal to the maximum and the minimum, respectively, for each control voltage VC because of variations in the fabrication process conditions.

In the PLL circuit, the control voltage VC is an output of a loop filter. The range of variable frequencies VL to VH of the output is usually determined by a power supply voltage and the threshold of FETs. In a case where a frequency Fm is equal to a reference clock frequency when the control voltage VC is equal to the middle value Vm between VL and VH, the range of a frequency of the VCO 10 in which the frequency can vary in the PLL circuit is maximized. Even if the VCO 10 is designed in this way, the VCO 10 is apt to become out of lock due to noise or a variation in clock frequency since the range of the frequency in which it can vary is narrow in a case where the frequency characteristic thereof is of POW according to variations in the fabrication process conditions. While in a case where the frequency characteristic thereof is of SPW, the VCO 10 cannot achieve in lock.

Figure 9B:
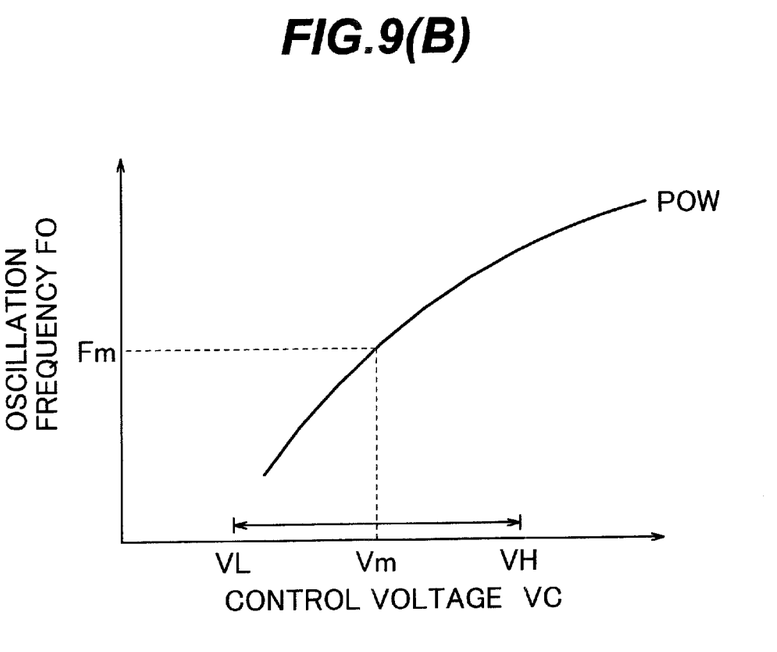

However, even in a case where the frequency characteristic thereof is of POW, if POW is translated in the positive direction along the VC axis to a position as shown in FIG. 9(B), the range of variable frequencies becomes wider to prevent the VCO 10 from being out of lock. The translation corresponds to adjustment of the value of the bias current IB so as to hold FO=Fm when VC=Vm in FIG. 8.

In the PLL circuit, if noise is superimposed on the control voltage VC, jitter arises in the waveform of the oscillation clock OCLK. It is possible to reduce the jitter by decreasing the ratio of an increment of the oscillation frequency FO to an increment of the control voltage VC (a VCO gain), that is, by decreasing the slope of the characteristic curve of the VCO 10.

Figure 10A:
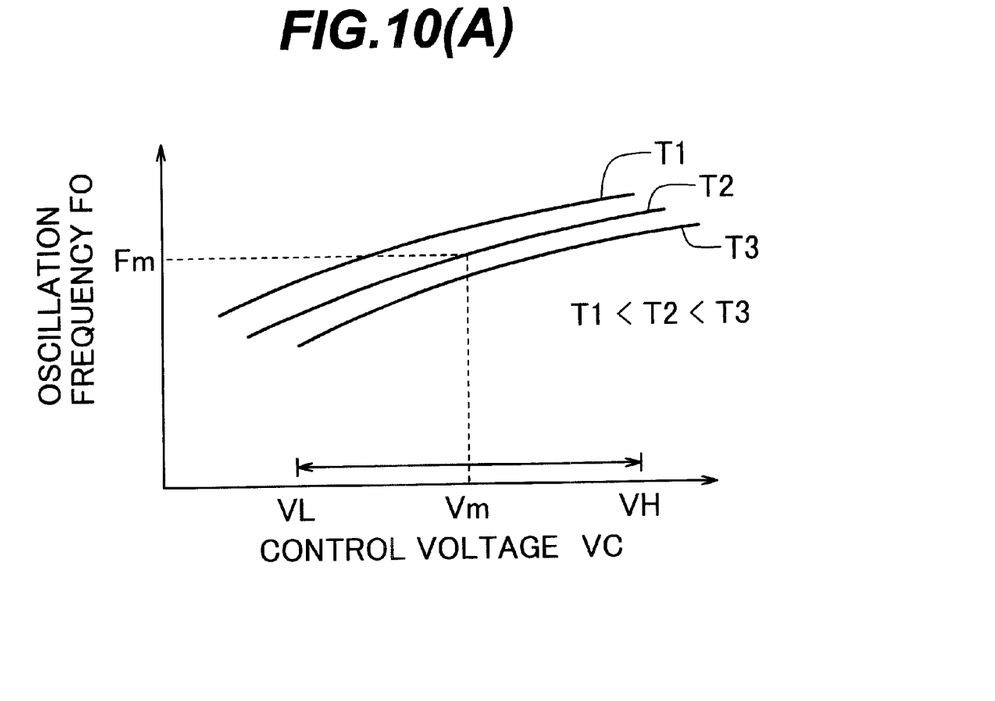
FIG. 10(A) is a graph showing characteristics of oscillation frequency FO versus control voltage VC of a voltage-controlled oscillator having a relatively small gain, at respective three different temperatures.
Figure 10B:
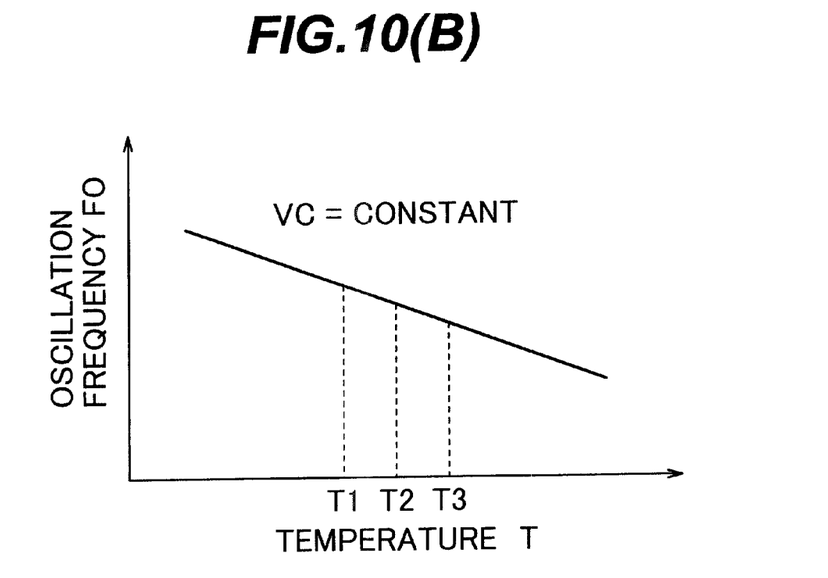
FIG. 10(B) is a graph showing a characteristic of oscillation frequency FO versus temperature when control voltage VC is constant.

On the other hand, the characteristics of the VCO 10 are also dependent on temperature as shown in FIG. 10(A). Characteristic curves in the figure show ones in cases where temperatures are T1, T2 and T3 wherein a relation T1<T2<T3 is satisfied. FIG. 10(B) shows a relationship between temperature T and the oscillation frequency FO under the condition that the control voltage VC is at a constant value.

If the VCO gain is small as shown in FIG. 10(A), the range of variable frequencies and a margin in the PLL circuit are narrow; therefore, a more correct adjustment of the bias current IB is required in order to prevent out of lock which is caused by variations in temperature and noise.

In JP 10-84278 A, a PLL circuit employing a replica of a CCO is used as an automatic bias adjustment circuit, and the output of a V/I converter circuit in a VCO is used as a bias current IB to the PLL circuit, which is an adjustment object, to deal with variations in process conditions and temperature.

However, when the VCO gain of the PLL circuit to be adjusted is reduced in order to restrict jitter to a low, the VCO gain of the bias adjustment circuit is also reduced; therefore, out of lock is easy to arise in the bias adjustment circuit, thereby disabling a proper bias current IB to be generated.

Meanwhile in JP 11-177416 A, in order to cope with variations in process conditions and temperature, the output of a loop filter is converted into a current by a D/A converter circuit to use the current as a bias current IB. However, since the bias current IB is proportional to the control voltage VC in this case, the control current of the CCO is also proportional to the control voltage VC; therefore the control current IC cannot be set to a value at the middle point of its range against variations in process conditions and temperature.

Furthermore in JP 10-70458 A, in order to cope with variations in process conditions and temperature, the output voltage of a loop filter is compared with a reference voltage having a temperature coefficient of almost zero, the count value of a counter is changed in accordance with the result of the comparison, and a bias switch is controlled by the count value to determine the state of a bias generator.

However, there is no description about how to change the count value, what the reference voltage is, how relationship between the input and output of the bias generator goes, how the output current range of the bias generator is limited by the bias switch, which makes the contents of the bias adjustment left unclear. Moreover, since the bias generator is always under digital control in order to deal with variation in temperature, since the value of the control current IC has a step change at each time of changing-over of the switch to produce jitter even on the assumption that the bias adjustment is enabled.

Furthermore, since in any of the above-published documents, the digital adjustment circuit is always in operation in order to deal with variation in temperature, power consumption increases.

SUMMARY OF THE INVENTION

Accordingly, it is an object of the present invention to provide an automatic bias adjustment circuit capable of giving a more proper bias current to a PLL circuit against variations in process conditions and temperature.

An automatic bias adjustment circuit according to present invention is for use in a PLL circuit. The PLL circuit is provided with voltage-controlled oscillator comprising: a voltage to current converter circuit converting a control voltage VC to a current IE; and a current-controlled oscillator receiving a control current IC which is obtained by adding a bias current IB to the converted current IE.

In one aspect of the automatic bias adjustment circuit according to present invention, the bias current IB is the sum of a first bias current adjusted for dealing with process variations and a second bias current for dealing with temperature variation. These first and second biases current are generated by a bias adjustment circuit and a bias current generating circuit, respectively.

The bias adjustment circuit adjusts the first bias current in response to an adjustment start signal such that the control voltage converges to a reference voltage, and ceases the adjustment when the convergence has been achieved.

The reference voltage is determined to be an almost middle point in the range of the variable control voltage.

The bias current generating circuit provides the second bias current having such a temperature characteristic that the control voltage is prevented from shifting from the reference voltage due to temperature variation.

Since the adjustment by the bias adjustment circuit is not performed after the first bias current having been adjusted such that the control voltage converges to the reference voltage, even if the characteristics of the voltage-controlled oscillator changes due to variation in temperature, the value of the first bias current does not rapidly change, thereby ensuring a stable operation of the PLL circuit.

After the adjustment, since the shift of the control voltage from the reference voltage due to variation in temperature is corrected by the bias current generating circuit, the control voltage is maintained at an almost middle point in the range of the variable control voltage. Thereby, the range of variable oscillation frequencies with maintaining in lock becomes almost the maximum independently of variation in temperature, and therefore even if the VCO gain is reduced in design in order to minimize jitter due to noise, it is possible to prevent out of lock from occurring.

In a case where the bias current generating circuit is constituted of a bias voltage generating circuit and a voltage to current converter circuit converting a generated bias voltage to a current which is the second bias current, the bias voltage generating circuit generates the bias voltage having a temperature characteristic which is reverse to that of the control voltage under the condition that the frequency of the oscillation signal is fixed.

Other aspects, objects, and the advantages of the present invention will become apparent from the following detailed description taken in connection with the accompanying drawings.

BRIEF DESCRIPTION OF THE DRAWINGS

FIGS. 9(A) and 9(B) are graphs each showing characteristics of oscillation frequency FO versus control voltage VC, of the circuit of FIG. 8, wherein FIG. 9(A) shows characteristic curves of VCOs fabricated on respective three different process conditions, in a case where temperature is constant and a bias current IB is equal to zero, while FIG. 9(B) shows a characteristic curve of a VCO having the characteristic curve POW in FIG. 9(A) with a bias current IB being adjusted.

DESCRIPTION OF THE PREFERRED EMBODIMENTS

Referring now to the drawings, wherein like reference characters designate like or corresponding parts throughout several views, preferred embodiments of the present invention are described below. A signal which is active low will be denoted with adding '*' to a reference character.

First Embodiment

Figure 1:
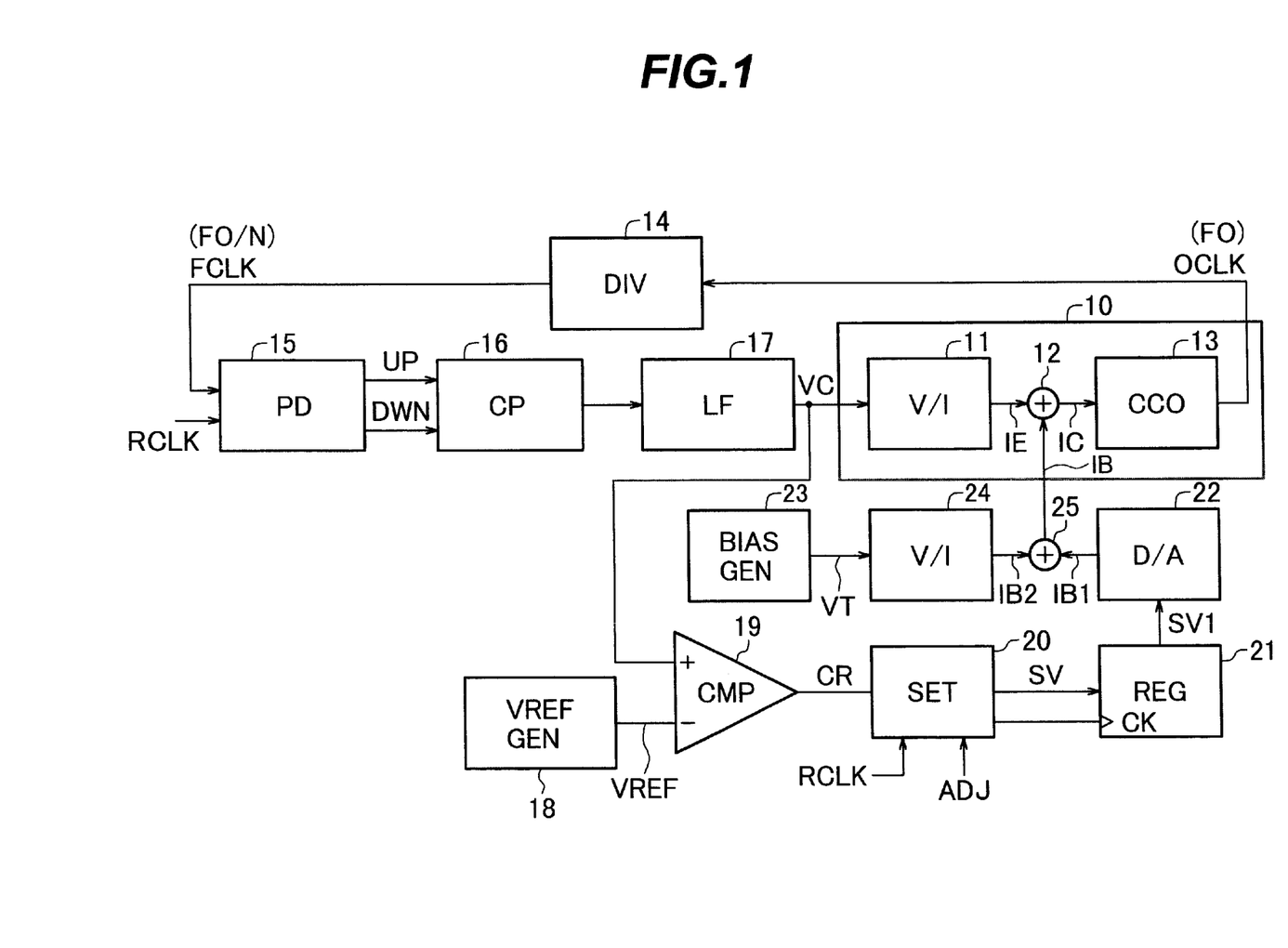
FIG. 1 is a block diagram showing a PLL circuit of a first embodiment according to the present invention.

FIG. 1 shows a PLL circuit of a first embodiment according to the present invention.

A VCO 10 has the same configuration as the VCO 10 of FIG. 8 and an oscillation clock OCLK with a frequency FO of the VCO 10 is provided to a divider by N, 14, to generate a feedback clock FCLK with a frequency FO/N. A phase comparator 15 detects lag or lead of the feedback clock FCLK with respect to a reference clock RCLK to generate a pulse of an up signal UP or a down signal DWN at each time of the lag or lead detection. A charge pump circuit 16 charges or discharges a filter capacitor in a loop filter 17 in response to a pulse of the up signal UP or the down signal DWN, respectively. The output of the loop filter 17 is given as a control voltage VC to a V/I converter circuit 11 of the VCO 10.

The frequency of the reference clock RCLK is usually shifted from a nominal frequency by variations in process conditions for its generating circuit and variation in temperature.

An automatic bias adjustment circuit giving a bias current IB to an adder 12 is added to the PLL circuit constituted of the VCO 10, the divider by N, 14, the phase comparator 15, the charge pump circuit 16, and the loop filter 17. Next, description will be given of this adjustment circuit.

In the embodiment, the bias current IB is the sum of a bias current IB1 adjusted for coping with variations in process conditions and a bias current IB2 for coping with variation in temperature.

Next, description will be given of a bias adjustment circuit (18, 19, 20, 21 and 22) generating a bias current IB1.

The control voltage VC is compared with a reference voltage VREF generated at a reference voltage generating circuit 18 by a comparator 19. The reference voltage generating circuit 18 is designed such that the output VREF thereof is equal to a value at the middle point in the range of the variable output voltage of the loop filter 17, that is, Vm of FIG. 10(A). Usually, this range of variable output voltage extends from Vth to (VDD−Vth), for example, from 0.2 to 1.6 V, where VDD is a power supply voltage and Vth is a threshold voltage of a FET. In this case, VREF=VDD2, which can be generated by a well-known voltage divider. The reference voltage generating circuit 18 is preferable for adjustment to a more proper bias current IB to be designed such that the reference voltage VREF maintains the value at above-described middle point against variation in temperature. For example, by connecting two resistors with the same resistance value in series between the power supply line and ground, the divided voltage VREF=VDD/2 can be obtained and the voltage VREF maintains the value at the above-described middle point even if there arises a variation in the power supply voltage VDD caused by variation in temperature.

The comparison result CR of the comparator 19 is high when VC>VREF, while being low when VC<VREF. The comparison result CR is provided to a register setting circuit 20 together with the reference clock RCLK and an adjustment start signal ADJ. The operation of the register setting circuit 20 is started by a pulse of the adjustment start signal ADJ given thereto and operates in synchronism with a clock obtained by dividing the reference clock RCLK. The register setting circuit 20 sets values SV to a register 21 so that a series of comparison results CR shows convergence of VC to VREF, and after the convergence, fixes the set value SV. That is, the register setting circuit 20, as detailed later, sets '1' to a selected bit as a test bit in the register 21 sequentially from the most significant bit to the least significant bit at predetermined cycles, and after setting or resetting the least significant bit, fixes the contents of the register 21.

An output value SV1 of the register 21 is converted into the bias current IB1 by a D/A converter circuit 22. The D/A converter circuit 22 can be constructed by connecting a plurality of circuits, each having a serial connection of a constant current source and a switching transistor, in parallel to each other. On and off of each switching transistor is determined by the set value SV1.

Next, description will be given of a bias current generating circuit (23 and 24) generating the bias current IB2.

A bias voltage VT generated at a bias voltage generating circuit 23 is converted into the bias current IB2 by a V/I converter circuit 24. Limitation imposed on the bias voltage VT depends on the conversion coefficient of the V/I converter circuit 24 and the range of the variable IB1, and for example, if the coefficient is equal to that of the V/I converter circuit 11 and if IB1>0, then VT<VREF, for example, VT=VREF/2. If IB1<0, then a relation VT≧VREFF can be admitted. The bias voltage generating circuit 23 is designed such that the bias voltage VT shows a temperature characteristic as described later.

The converted bias currents IB1 and IB2 are summed by an adder 25 to provide the sum as the bias current IB to the adder 12 of the VCO 10. Because of addition of currents, each of the adders 25 and 12 can be constructed of a simple wire connection.

The circuit of FIG. 1 is formed in a semiconductor integrated circuit device, wherein the loop filter 17 may be externally provided for reduction in chip area.

Figure 2:
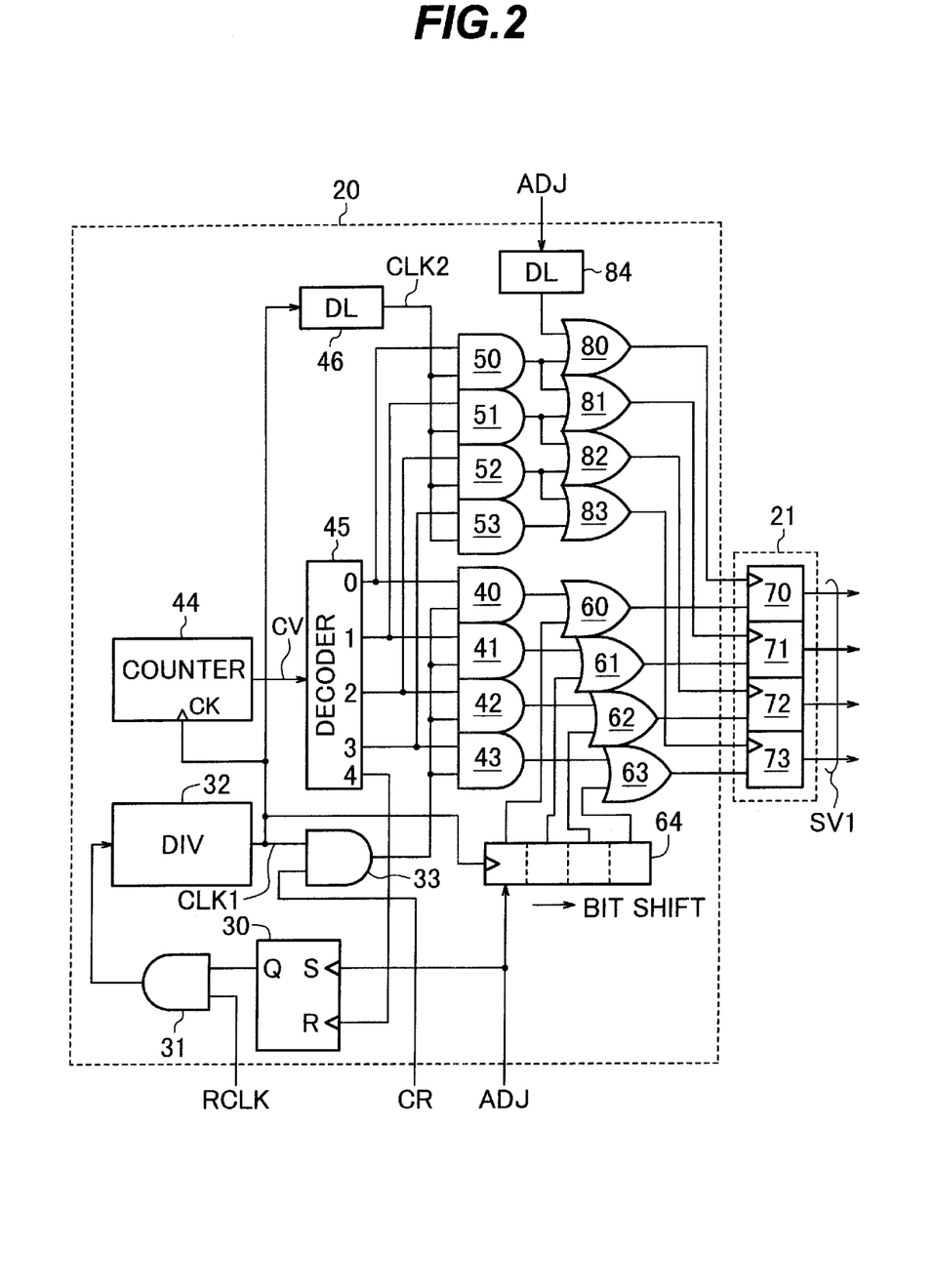
FIG. 2 is a logic circuit diagram showing an embodiment of the register setting circuit of FIG. 1 together with a register.

FIG. 2 shows an embodiment of the register setting circuit 20 of FIG. 1 together with the register 21.

An RS flip-flop 30 is set by a pulse of the adjustment start signal ADJ and the non-inverting output thereof is provided to one input of an AND gate 31. A pulse of the adjustment start signal ADJ is generated by a circuit not shown when power is turned on. The reference clock RCLK is provided to the other input of the AND gate 31. The reference clock RCLK passes through the AND gate 31 when the RS flip-flop 30 is in a set state and the passed clock RCLK is provided to a divider by M, 32, to generate an operating clock CKL1 in order to place the circuits 20 and 21 into an operating state, wherein M is determined such that a half cycle of the clock CLK1 is longer than a time from the reference clock RCLK being provided to the PLL circuit of FIG. 1 till the PLL circuit becoming in lock.

The clock CLK1 is provided to one input of an AND gate 33 and the comparison result CR is provided to the other input thereof. The output of the AND gate 33 is provided to one input of each of AND gates 40 to 43. The clock CLK1 is also provided to the clock input CK of a counter 44 and a three bit count CV thereof is provided to a decoder 45 to be decoded. The decoder 45 has 5 outputs each going '1' when the count CV has a corresponding one of values 0 to 4. The clock CLK1 is further provided through a delay circuit 46 to one input of each of AND gates 50 to 53 as a clock CLK2.

Four outputs of the decoder 45, each of which goes high when the count CV becomes corresponding one of values 0 to 3, are provided not only to the other inputs of the respective AND gates 40 to 43, but also to the other inputs of the respective AND gates 50 to 53.

The outputs of the AND gates 40 to 43 are provided to one inputs of respective OR gates 60 to 63, and to the other inputs of the respective OR gates 60 to 63, there are provided respective bits of a 4 bit shift register 64, for outputting a test bit, in the order from the least to most significant bits. The shift register 64 is set to '1000' in response to a pulse of the adjustment start signal ADJ. The clock CLK1 is provided to the clock input CK of the shift register 64, and the '1' (test bit) thereof is shifted to the right and '0' is loaded at the least significant bit thereof every rise of the clock CLK1.

The outputs of the OR gates 60 to 63 are provided to data inputs of respective D flip-flops 70 to 73 of the register 21, and the outputs of OR gates 80 to 83 are provided to the clock inputs of the D flip-flops 70 to 73. To the OR gate 80, there are provided a signal obtained by passing the adjustment start signal ADJ through a delay circuit 84 and the output of the AND gate 50. To the OR gate 81, there are provided the outputs of the AND gates 50 and 51. To the OR gate 82, there are provided the outputs of the AND gates 51 and 52. To the OR gate 83, there are provided the outputs of the AND gates 52 and 53.

The RS flip-flop 30 is reset by an output of the decoder 45 which is high when CV=4.

Figure 3:
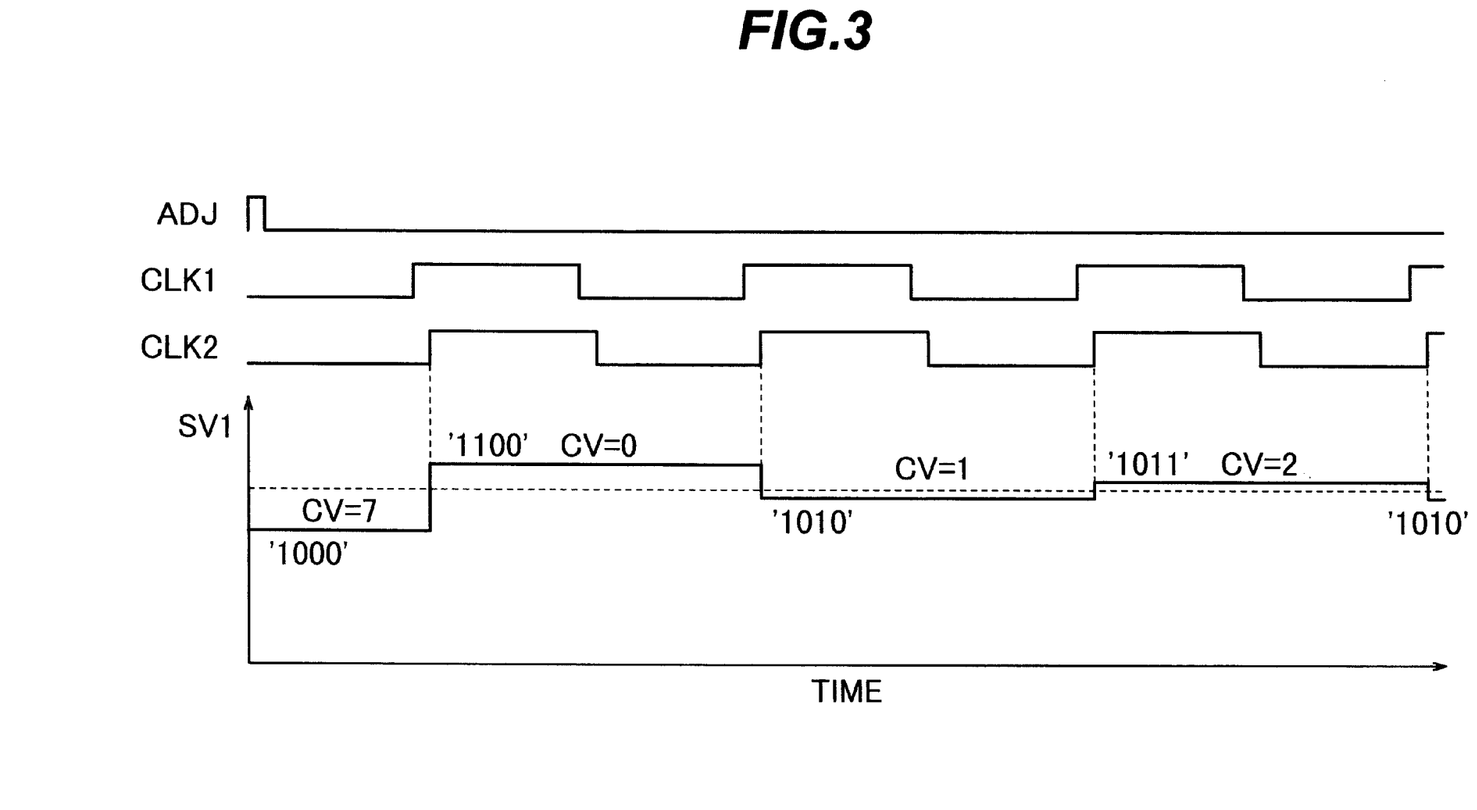
FIG. 3 is a time chart showing operation of the circuit of FIG. 2.

FIG. 3 is a time chart showing operation of the circuit of FIG. 2.

Next, referring to FIG. 3, description will be given of operations of the circuit of FIGS. 1 and 2. A dotted lateral line in FIG. 3 indicates the set value SV1 to achieve VC=VREF, that is, the target value of the set value SV1.

Assume that the divider by M, 32, the shift register 64, and the register 21 are cleared to zero by an initialization circuit not shown when power is turned on and the counter 44 has a loaded value 7. In this state, each of the five outputs of the decoder 45 is '0.'

(1) The RS flip-flop 30 is set by a pulse of the adjustment start signal ADJ and the reference clock RCLK is provided to the divider by M, 32, through the AND gate 31. Further, by a pulse of the adjustment start signal ADJ, the contents of the shift register 64 becomes '1000,' and the least significant bit '1' is provided as a test bit to the data input of the D flip-flop 70 through the OR gate 60. Next, a pulse of the adjustment start signal ADJ having passed through the delay circuit 84 is provided to the clock input of the D flip-flop 70 through the OR gate 80 to set the test bit '1' into the D flip-flop 70, and thereby SV1=8. In FIG. 1, if the maximum of the bias current IB1 is denoted by IBmax, then IB1=8·IB1max/15.

When it has approached a half cycle of the clock CLK1, the PLL circuit has been in lock and the control voltage VC is already stable. In the case of FIG. 3, VC>VREF and the comparison result CR is a logic high.

(2) When the half cycle of the clock CLK1 has passed, the clock CLK1 rises, and CV=0 and the gates 40 and 50 are opened to provide an output '1' of the AND gate 33 to the data input of the D flip-flop 70 through the AND gate 40 and the OR gate 60 as a fixed bit (a bit fixed by the comparison result CR). Further, the contents of the shift register 64 are shifted on the higher order side by one bit to become '0100' and this '1' is provided as a test bit to the data input of the D flip-flop 71 through the OR gate 61.

Next, the clock CLK2 rises and passes through the AND gate 50, and further provided through the OR gates 80 and 81 to the clock inputs of the D flip-flops 70 and 71 to cause the clock inputs thereof to rise and set a fixed bit '1' and a test bit '1' into the D flip-flops 70 and 71, respectively, with the result that SV1=12 and IB1=12·IB1max/15.

Just before the next rise of the clock CLK1, the PLL circuit has been in lock and the control voltage is already stable. In the case of FIG. 3, VC<VREF and the comparison result CR is a logic low.

(3) The clock CLK1 rises to cause CV=1, the AND gates 41 and 51 are opened, and an output '0' of the AND gate 33 passes through the AND gate 41 and the OR gate 61 to provide to the data input of the flip-flop 71 as a fixed bit. Further, the contents of the shift register 64 are shifted on the higher order side by one bit to become '0010' and this '1' is provided as a test bit through the OR gate 62 to the data input of the D flip-flop 72.

Next, the clock CLK2 rises and passes through the AND gate 51, further provided through the OR gates 81 and 82 to the clock inputs of the D flip-flops 71 and 72 to set a fixed bit '0' and a test bit '1' into the D flip-flops 71 and 72, respectively, with the result that SV1=10 and IB1=10·IB1max/15.

Just before the next rise of the clock CLK1, the PLL circuit has been in lock and the control voltage is already stable. In the case of FIG. 3, VC>VREF and the comparison result CR is a logic high.

Such operations are repeated and when CV=3, then SV1=10. When CV=4 is achieved by the next rise of the clock CLK1, the RS flip-flop 30 is reset by the decoder 45 to cease the provision of the reference clock RCLK to the divider by M, 32, and further, cease the operation of the register setting circuit 20 and the register 21, whereby the set value SV1 is fixed.

With operation as described above, a value of the register 21 is set by the register setting circuit 20 such that the control voltage VC converges to the reference voltage VREF, and the actual use of the PLL circuit is started.

Although the shift of the control voltage VC from the middle point of the range of the variable control voltage VC in the PLL circuit is caused by variations in process conditions and a deviation of the reference clock RCLK from the nominal frequency, with the above setting, that is, with adjustment of the bias current IB1, correction on the shift is achieved.

Since the set value SV1 is not changed even if characteristics of the CCO 13 changes due to a variation in temperature after the setting, the value of the bias current IB does not rapidly change during the use of the PLL circuit, thereby ensuring a stable operation of the PLL circuit.

Next, description will be given of a case where change in temperature arises after the above-described setting.

Generally speaking, characteristics of an analog circuit have temperature dependency. Meanwhile, characteristics of the CCO 13 have a large influence of temperature in comparison with those of the V/I converter circuit 11 and the loop filter 17 which are analog circuits. Therefore, with change in temperature, the PLL circuit operates so as to maintain in lock, and as a result the control voltage VC shifts from the value at the middle point of a range of the variable control voltage VC.

For example, when the control voltage VC is constant, if temperature rises by ΔT, then the VCO 10 reduces the oscillation frequency FO as shown in FIG. 10(B). For this reason, when temperature rises in the PLL circuit, a current IC increases by ΔIC, that is, the control voltage VC increases to operate such that the frequency of the feedback clock FCLK coincides with that of the reference clock RCLK. Therefore, the temperature characteristic of the bias voltage generating circuit 23 is determined in design such that the bias current IB2 increases by ΔIC with increase in temperature by ΔT. In this case, the output voltage VT of the bias voltage generating circuit 23 has a temperature characteristic which is reverse to that of the control voltage VC under the condition that the frequency FO of the oscillation clock OCLK is fixed in regard to the VCO 10.

Figure 4A:
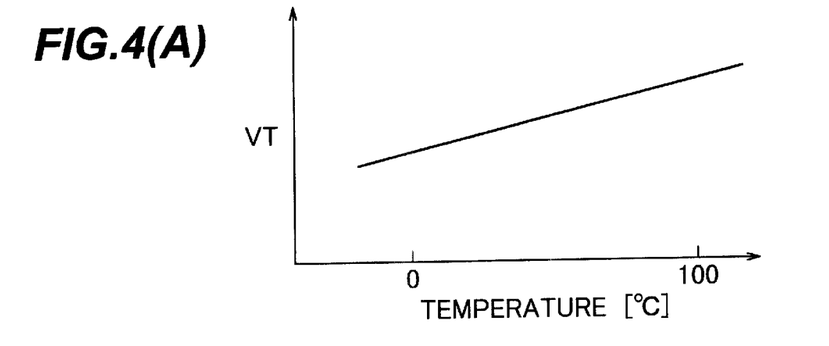
FIG. 4(A) is a graph showing changes in bias voltage VT versus temperature.

FIG. 4(A) shows changes in bias voltage VT versus temperature.

Figure 4B:
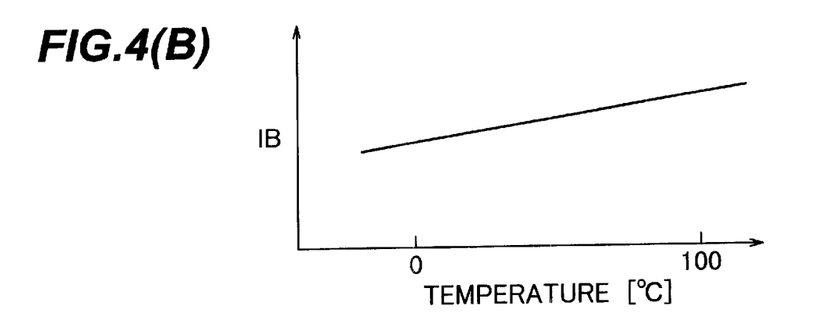
FIG. 4(B) is a graph showing changes in bias current IB versus temperature and FIG. 4(C) is a graph showing changes in control voltage VC versus temperature when a PLL circuit is in lock.
Figure 4C:
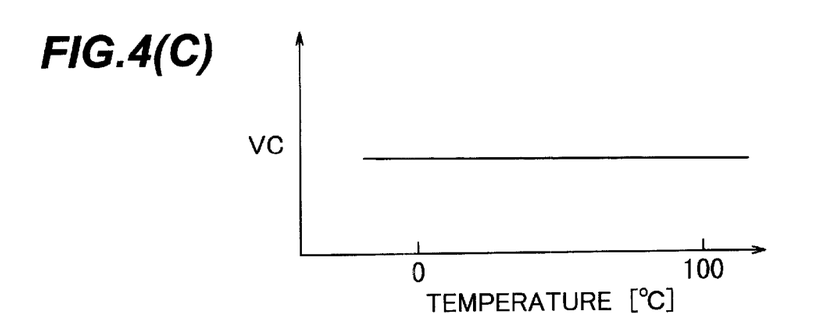

Since the bias voltage VT increases with rise in temperature, the bias current IB2 also increases, and thereby, the bias current IB=IB1+IB2 increases as shown in FIG. 4(B). Since the bias current IB2 increases with increase in the control current IC, the frequency FO/N increases without increase in the control voltage VC to cause the frequency FO/N to coincide with that of the reference clock RCLK. For this reason, as shown in FIG. 4(C), the control voltage VC maintains constant in spite of variation in temperature.

In such a way, even when temperature changes after the contents of the register 21 are fixed, the control voltage VC is maintained at a value of an almost middle point in the range of the variable control voltage VC, and thereby the range of the variable oscillation frequency FO becomes almost the maximum in spite of change in temperature, thereby enabling to prevent out of lock from occurring even with a small VCO gain designed for reducing jitter due to noise.

In the prior art, a digital automatic bias adjustment circuit was operated at all times in order to deal with variation in temperature. However in the present embodiment, since the digital bias adjustment circuit ceases its operation after the initial adjustment, power consumption can be reduced and the lifetime of a battery can be extended when the PLL circuit is employed especially in a mobile electronic equipment such as a portable telephone.

Note that depending on a circuit configuration, the CCO 13 may have a temperature characteristic which is reverse to that of FIG. 10(B). In such a case, it is only required that the temperature characteristic of the bias voltage generating circuit 23 is reversed according to such circumstances.

It is well known to those skilled in the art that the slope of temperature characteristic of the bias voltage generating circuit 23 can be properly set to a positive coefficient or a negative coefficient. For example, when a resistor and a constant current source are connected in series between a power supply line and ground, a voltage at a connection node between the resistor and the constant current source can be taken out as the bias voltage VT, then the bias voltage VT has a temperature characteristic of the resistor. In this case, by connecting one end of the resistor to the power supply line or ground, the temperature characteristic of the bias voltage VT is reversed. When a voltage across a diode through which a forward current flows is employed instead of the resistor, the same effect can be exerted.

Further, by changing the conversion coefficient of the V/I converter circuit 24, the temperature characteristic of the bias voltage VT can be close to a more preferable one.

Second Embodiment

Figure 5:
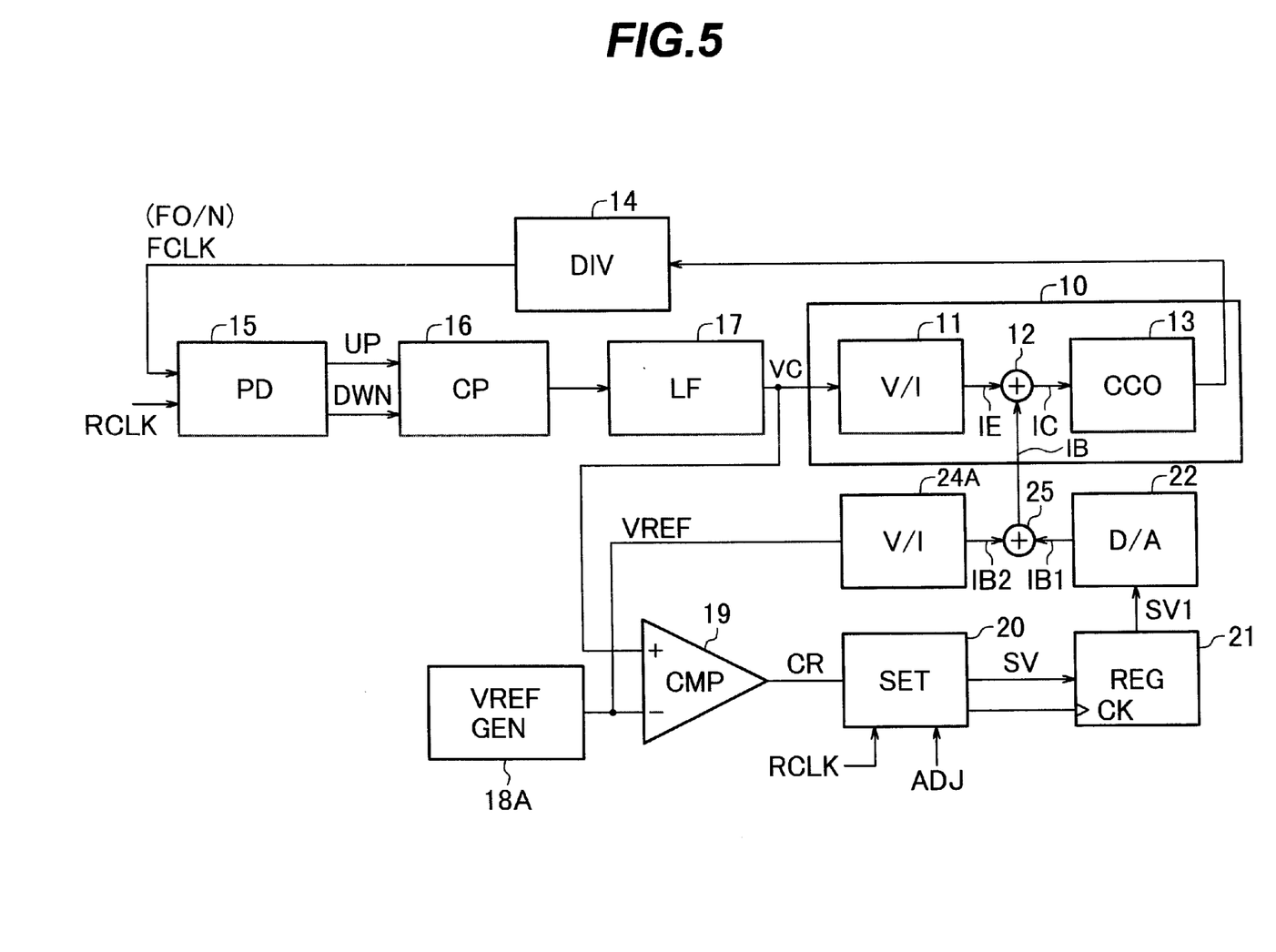
FIG. 5 is a block diagram showing a PLL circuit of a second embodiment according to the present invention.

FIG. 5 shows a PLL circuit of a second embodiment according to the present invention.

In this circuit, the bias voltage generating circuit 23 of FIG. 1 is omitted and the output of a reference voltage generating circuit 18A is provided to a V/I converter circuit 24A. The conversion coefficient k2 of the V/I converter circuit 24A is smaller than that k1 of the V/I converter circuit 24, wherein a relation IB2=k1·VT=k2·VREF is satisfied. In this case, a relation IB1>0 can be applied. If a limitation on IB1 is eliminated, the limitation on the conversion coefficient is eliminated as well.

The reference voltage generating circuit 18A has such a temperature characteristic that the above-described temperature compensation is performed for the control voltage VC.

Third Embodiment

Figure 6:
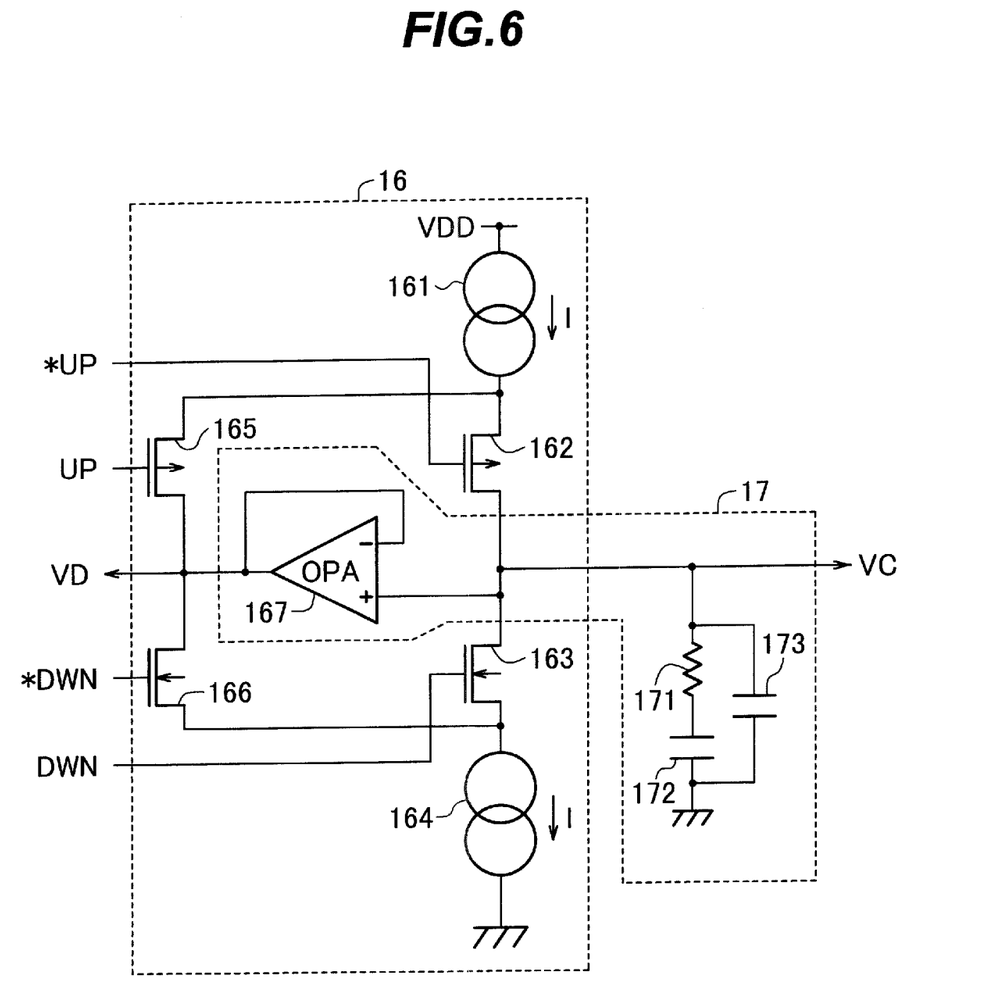
FIG. 6 is a diagram showing an structural example of a charge pump circuit and a loop filter to be employed in a PLL circuit, of a third embodiment according to the present invention.

FIG. 6 shows an embodiment of a charge pump circuit 16 and a loop filter 17 employed in a PLL circuit, of a third embodiment according to the present invention.

In the charge pump circuit 16, a constant current source 161, a PMOS transistor 162, an NMOS transistor 163 and a constant current source 164 are connected in series between VDD and ground. A PMOS transistor 165 and an NMOS transistor 166 are connected in series between the sources of the PMOS transistor 162 and the MOS transistor 163. The charge pump circuit 16 has a characteristic in that the input of a voltage follower circuit 167 is connected to the drain (a voltage VC) of the PMOS transistor 162, the output of the voltage follower circuit 167 is connected to the drain of the PMOS transistor 165, and the output voltage VD thereof is provided to the non-inverting input of the comparator 19 of FIG. 1 or 5.

The up signal UP and the down signal DWN are provided to the gates of the PMOS transistor 165 and the NMOS transistor 163, respectively, and the inverted signals *UP and *DWN of the signals UP and DWN are provided to the gates of the PMOS transistor 162 and the NMOS transistor 166.

The loop filter 17 has a well-known configuration in which a resistor 171 and a filter capacitor 172 are connected in series between the output of the charge pump circuit 16 and ground and a phase compensation filter capacitor 173 is connected in parallel thereto.

The voltage follower circuit 167 is not only a constituent of the charge pump circuit 16, but also a constituent of the loop filter 17. That is, the voltage follower circuit 167 also serves as a voltage output buffer circuit in the loop filter 17.

In the above configuration, when the up signal UP and the down signal DWN are both low and inactive, the PMOS transistor 162 and the NMOS transistor 163 are off, while the PMOS transistor 165 and the NMOS transistor 166 are both on, and thereby a current I flowing through the constant current source 161 flows through the transistors 165 and 166 to the constant current source 164.

By a positive pulse of the up signal UP, the PMOS transistor 162 is turned on while the PMOS transistor 165 is turned off to output the current I through the PMOS transistor 162 and charge the filter capacitors 172 and 173. Since, at this time, the NMOS transistor 163 is off but the NMOS transistor 166 is on, the current I can be taken out from the output of the voltage follower circuit 167 by the constant current source 164.

Figure 7:
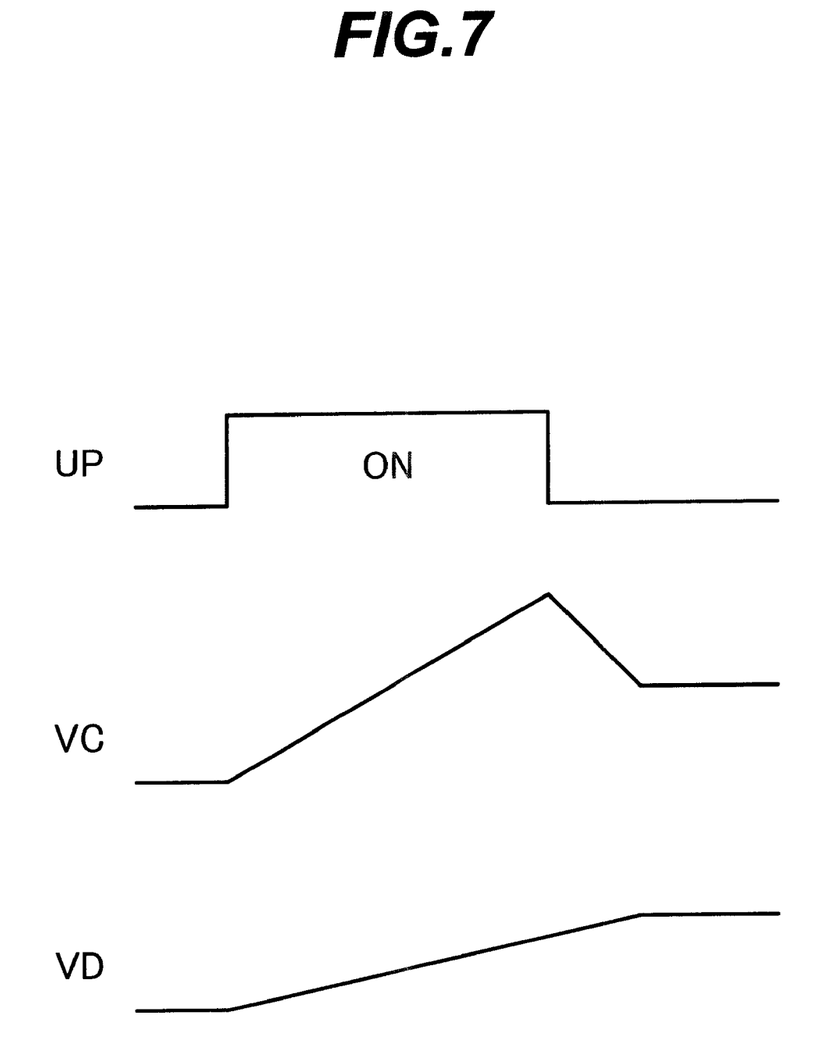
FIG. 7 is a diagram of voltage waveforms of signals VD and VC in relation to a pulse of an up signal UP, showing operation of the circuit of FIG. 6.

FIG. 7 shows voltage waveforms of signals VD and VC in relation to a pulse of the up signal UP.

In a low frequency region, a relation VC=VD holds. When the PMOS transistor 162 is turned off by a rise of the up signal UP, part of an electric charge on the filter capacitor 173 flows to the PMOS transistor 162 side due to the gate to drain capacitance of the PMOS transistor 162, thereby reducing the voltage VD instantaneously. However, since a pulse duration of the up signal UP is as short as several nanoseconds for example, the output VD of the voltage follower circuit 167 cannot follow such a high speed change in the voltage VC; therefore, change in the voltage VD is milder than that of the voltage VC. Thereby, more proper comparison by the comparator 19 in FIG. 1 or 5 is achieved, and a value set in the register becomes a more proper one.

By a positive pulse of the down signal DWN, the NMOS transistor 163 is turned on, while the NMOS transistor 166 is turned off to discharge part of the electric charge on the filter capacitors 172 and 173 through the NMOS transistor 163 and the constant current source 164. At this time, although the PMOS transistor 162 is off, since the PMOS transistor 165 is on, the current I flowing through the constant current source 161 flows into the input of the voltage follower circuit 167.

When the NMOS transistor 163 is turned off by a fall of the down signal DWN, part of the electric charge on the filter capacitance 173 flows to the NMOS transistor 163 side due to the gate to drain capacitance of the NMOS transistor 163 to further reduce the control voltage VC instantaneously. However, by the above-described same reason, a change in the voltage VD becomes milder than that of the voltage VC, whereby the same effect as above is obtained.

Note that other various kinds of modification are included in the present invention.

For example, a configuration may be adopted in which the output VD of the voltage follower 167 of FIG. 6 is provided to the VCO 10 as the control voltage.

In FIG. 1, in a case where the phase comparator 15 outputs an analog error signal, there is no necessity to provide the charge pump circuit 16 (a combination of the digital phase comparator 15 and the charge pump circuit 16 can be regarded as an analog phase comparator).

The automatic bias adjustment circuit of the present invention can be applied to a PLL circuit with no divider by N, 14.

Furthermore, the register setting circuit 20 may be of a configuration in which the set value SV is sequentially incremented or decremented.

The addition of the first bias and the second bias may be performed on a signal line between the loop filter 17 and the CCO 13. That is, the addition may be performed on the input side of the V/I converter 11 instead of the output side thereof. In this case, since the operation is addition of voltages, the V/I converter circuit 24 is omitted and the D/A converter has a voltage output. Further, addition of one of the first bias and the second bias to the signal line between the circuits 17 and 13 may be performed on the input side of the V/I converter circuit 11 and addition of the other thereof may be performed on the output side of the V/I converter circuit 11.

In addition, it is natural that the reference signal is not required to be a clock signal, but may be a data signal generated in synchronism with a clock signal.

What is claimed is:

1. An automatic bias adjustment circuit adjusting a bias current for a PLL circuit which includes: a loop filter; a voltage to current converter circuit converting an output voltage of said loop filter as a control voltage to a current; and a current-controlled oscillator, receiving a control current which is obtained by adding said bias current to said converted current, said bias current being a sum of first and second bias currents, generating an oscillation signal responsive to said control current; wherein said PLL circuit operates so that said oscillation signal or a signal obtained by dividing said oscillation signal is locked on a reference signal received, said automatic bias adjustment circuit comprising:
   a bias adjustment circuit, providing said first bias current, adjusting said first bias current in response to an adjustment start signal such that said control voltage converges to a reference voltage; and
   a bias current generating circuit, providing said second bias current which changes with temperature such that said control voltage is prevented from shifting from said reference voltage due to temperature variation.

2. The automatic bias adjustment circuit of claim 1, wherein said bias adjustment circuit ceases the adjustment when the convergence has been achieved.

3. The automatic bias adjustment circuit of claim 2, wherein said bias current generating circuit comprises:
   a bias voltage generating circuit generating a bias voltage which has a temperature characteristic reverse to that of said control voltage; and
   a voltage to current converter circuit converting said bias voltage to a current which is said second bias current.

4. The automatic bias adjustment circuit of claim 2, further comprising: a reference voltage generating circuit generating said reference voltage which has a temperature characteristic reverse to that of said control voltage under a condition that a frequency of said oscillation signal is fixed;
   wherein said bias current generating circuit comprises: a voltage to current converter circuit converting said reference voltage to a current which is said second bias current.

5. The automatic bias adjustment circuit of claim 2, wherein said bias adjustment circuit comprises:
   a comparator comparing said control voltage with said reference voltage;
   a register;
   a D/A converter converting an output of said register to a current which is said first bias current; and
   a register setting circuit, setting bits of said register bit by bit in cycles in response to said adjustment start signal, setting or resetting the set bit according to a comparison result of said comparator, fixing contents of said register after the operation of setting or resetting.

6. The automatic bias adjustment circuit of claim 5, wherein said register setting circuit sets said bits of said register in a order from the most significant bit to the least significant bit.

7. A PLL circuit comprising:
   a loop filter;
   a voltage to current converter circuit converting an output voltage of said loop filter as a control voltage to a current; and
   a current-controlled oscillator, receiving a control current which is obtained by adding a bias current to said converted current, said bias current being a sum of first and second bias currents, generating an oscillation signal responsive to said control current;
   wherein said PLL circuit operates so that said oscillation signal or a signal obtained by dividing said oscillation signal is locked on a reference signal received, and said PLL circuit further comprising:
   a bias adjustment circuit, providing said first bias current, adjusting said first bias current in response to an adjustment start signal such that said control voltage converges to a reference voltage; and
   a bias current generating circuit, providing said second bias current which changes with temperature such that said control voltage is prevented from shifting from said reference voltage due to temperature variation.

8. The PLL circuit of claim 7, wherein said bias adjustment circuit ceases the adjustment when the convergence has been achieved.

9. The PLL circuit of claim 8, wherein said bias current generating circuit comprises:
   a bias voltage generating circuit generating a bias voltage which has a temperature characteristic reverse to that of said control voltage; and
   a voltage to current converter circuit converting said bias voltage to a current which is said second bias current.

10. The PLL circuit of claim 8, further comprising: a reference voltage generating circuit generating said reference voltage which has a temperature characteristic reverse to that of said control voltage under a condition that a frequency of said oscillation signal is fixed;
    wherein said bias current generating circuit comprises: a voltage to current converter circuit converting said reference voltage to a current which is said second bias current.

11. The PLL circuit of claim 8, wherein said bias adjustment circuit comprises:
    a comparator comparing said control voltage with said reference voltage;
    a register;
    a D/A converter converting an output of said register to a current which is said first bias current; and
    a register setting circuit, setting bits of said register bit by bit in cycles in response to said adjustment start signal, setting or resetting the set bit according to a comparison result of said comparator, fixing contents of said register after the operation of setting or resetting.

12. The automatic bias adjustment circuit of claim 11, wherein said register setting circuit sets said bits of said register in a order from the most significant bit to the least significant bit.

13. The PLL circuit of claim 8, wherein said loop filter includes a filter capacitor, said PLL circuit further comprising:
    a phase comparator generating a pulse signal responsive to said oscillation signal or a signal obtained by dividing said oscillation signal with respect to said reference signal; and
    a charge pump circuit charging or discharging said filter capacitor in response to said pulse signal.

14. The PLL circuit of claim 13, wherein said charge pump circuit comprises:
    a first constant current source;
    a second constant current source;
    first and second switching transistors connected in series between said first and second constant current sources;

third and fourth switching transistors connected in series between said first and second constant current sources; and a voltage follower circuit having an input connected to a connection node between said first and second switching transistors, and an output connected to a connection node between said third and fourth switching transistors;

wherein said loop filter is connected to said input of said voltage follower circuit and said output of said voltage follower circuit is an output of said loop filter.

15. An automatic bias adjustment circuit adjusting a bias current for a PLL circuit which includes: a loop filter having an output; a voltage to current converter circuit, having an input connected to said output of said loop filter, converting a control voltage at said input thereof to a current, having an output to provide said converted current; a current-controlled oscillator, having an input connected to said output of said voltage to current converter circuit, generating an oscillation signal responsive to a control current at said input thereof; and an adder, having first and second inputs and an output, interposed into a signal channel between said loop filter and said current-controlled oscillator with connecting said first input and output thereof, said second input receiving a bias signal which is a sum of first and second bias signals; wherein said PLL circuit operates so that said oscillation signal or a signal obtained by dividing said oscillation signal is locked on a reference signal received, said automatic bias adjustment circuit comprising:

a bias adjustment circuit, providing said first bias signal, adjusting said first bias signal in response to an adjustment start signal such that said control voltage converges to a reference voltage; and a bias signal generating circuit providing said second bias signal which changes with temperature such that said control voltage is prevented from shifting from said reference voltage due to temperature variation.

16. The automatic bias adjustment circuit of claim 15, wherein said bias adjustment circuit ceases the adjustment when the convergence has been achieved.

17. A bias adjustment method for adjusting a bias current for a PLL circuit which includes: a loop filter; a voltage to current converter circuit converting an output voltage of said loop filter as a control voltage to a current; and a current-controlled oscillator, receiving a control current which is obtained by adding said bias current to said converted current, generating an oscillation signal responsive to said control current; wherein said PLL circuit operates so that said oscillation signal or a signal obtained by dividing said oscillation signal is locked on a reference signal received, said method comprising the steps of:

providing a sum of first and second bias currents as said bias current, adjusting said first bias current such that said control voltage converges to a reference voltage; and changing said second bias current with temperature such that said control voltage is prevented from shifting from said reference voltage variation due to temperature variation.

18. The bias adjustment method of claim 17, wherein the adjustment is ceased when the convergence has been achieved.

19. The bias adjustment method of claim 17, wherein said changing is independent of said adjusting.

* * * * *